(12) United States Patent
Tsubaki

(10) Patent No.: US 6,528,981 B1
(45) Date of Patent: Mar. 4, 2003

(54) LOW-VOLTAGE CURRENT MIRROR CIRCUIT

(75) Inventor: Kazunari Tsubaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/926,717

(22) PCT Filed: Jul. 23, 1999

(86) PCT No.: PCT/JP99/03971
§ 371 (c)(1),
(2), (4) Date: Dec. 6, 2001

(87) PCT Pub. No.: WO01/08299
PCT Pub. Date: Feb. 1, 2001

(51) Int. Cl.$^7$ ................................................ G05F 3/16
(52) U.S. Cl. ..................................................... 323/315
(58) Field of Search ................................ 323/315, 314, 323/313, 312, 311; 327/538, 540, 535, 543; 330/288

(56) References Cited

U.S. PATENT DOCUMENTS

| | | | | |
|---|---|---|---|---|
| 4,550,284 A | * | 10/1985 | Sooch | 323/315 |
| 4,588,941 A | * | 5/1986 | Kerth et al. | 323/314 |
| 4,983,929 A | * | 1/1991 | Real et al. | 330/288 |
| 5,835,994 A | * | 11/1998 | Adams | 323/515 |
| 5,966,005 A | * | 10/1999 | Fujimori | 323/315 |
| 6,211,659 B1 | * | 4/2001 | Singh | 323/315 |

FOREIGN PATENT DOCUMENTS

| JP | 51-44859 | 4/1976 |
|---|---|---|
| JP | 0 6-13820 A | 1/1994 |

* cited by examiner

*Primary Examiner*—Rajnikant B. Patel
(74) *Attorney, Agent, or Firm*—Arent Fox Kintner Plotkin & Kahn

(57) ABSTRACT

The low voltage current mirror circuit of the present invention including multiple circuit elements each forming a current mirror, and concatenating the multiple circuit elements to form a cascode current mirror circuit, comprises voltage dropping means for mutually connecting inter-control-electrode nodes of each of the multiple circuit elements, to cause the predetermined voltage drop between the inter-control-electrode nodes. According to such a simplified constitution, it is realized to lower the input voltage and output voltage of the current mirror circuit.

6 Claims, 13 Drawing Sheets

LOW-VOLTAGE CURRENT MIRROR CIRCUIT

This application is a 371 of PCT/JP99/03971 filed on Jul. 23, 1999.

TECHNICAL FIELD

The present invention relates to a current mirror circuit used for a semiconductor integrated circuit and the like, and particularly to a cascode current mirror circuit that operates at a low voltage.

BACKGROUND ART

Generally, current mirror circuits are used as current amplifiers and the like for supplying output currents proportional to input currents. Further, in a case where it is required to supply an output current with high precision, a plurality of current mirror circuits are concatenated into a so-called cascode constitution to obtain a large output resistance.

FIG. 1 is a circuit diagram showing an exemplary structure of a general cascode current mirror circuit.

In FIG. 1, the current mirror circuit such as in a two-staged cascode constitution comprises four n-channel MOS transistors 11 to 14, a current source 3, and an output terminal 4. In this circuit structure, a first stage current mirror circuit and a second stage current mirror circuit are made up by the n-channel MOS transistors 11, 12 and the n-channel MOS transistors 13, 14, respectively, and the first stage current mirror circuit and the second stage current mirror circuit are mutually concatenated.

The current mirror circuit having such a constitution is input with an input current Iin through a drain terminal of the n-channel MOS transistor 11, to output an output current Io through a drain terminal of the n-channel MOS transistor 12.

Assuming now that each of the n-channel MOS transistors 11 to 14 has a threshold voltage Vth and a value obtained by subtracting the threshold voltage Vth from a gate/source voltage Vgs of each of the n-channel MOS transistors 11 to 14 is $\alpha$ (i.e., Vgs-Vth=$\alpha$; assuming that a drain current is equal to the input current Iin), a gate voltage value of the n-channel MOS transistor 14 becomes Vth+$\alpha$ and a gate voltage value of the n-channel MOS transistor 12 becomes 2(Vth+$\alpha$).

FIG. 2 is a graph showing a relationship between an output voltage Vo and the output current Io in the current mirror circuit of FIG. 1.

In FIG. 2, when a value of the output voltage Vo (a voltage of the output terminal 4 connected to the drain terminal of the n-channel MOS transistor 12) is 2$\alpha$ or less, each of the n-channel MOS transistors 12, 14 operates in a non-saturation region (triode region); and when the value of the output voltage Vo is between 2$\alpha$ and (Vth+2$\alpha$), the n-channel MOS transistor 12 operates in the non-saturation region and the n-channel MOS transistor 14 operates in a saturation region (pinch-off region). Further, when the value of the output voltage Vo is Vth+2$\alpha$ or higher, each of the n-channel MOS transistors 12, 14 operates in the saturation region. Namely, in the region where the value of the output voltage Vo is Vth+2$\alpha$ or higher, an inclination of curve Vo-Io is extremely small to thereby attain an extremely large output resistance, so that the output current Io with high precision can be obtained.

However, to obtain the output current Io with high precision, the cascode current mirror circuit as described above is required to operate at an input voltage of 2(Vth+$\alpha$) or higher and at the output voltage Vo of Vth+2$\alpha$ or higher, causing a problem of narrow settable ranges for the input/output voltages, and resulting in difficulty particularly in using the current mirror circuit in a low voltage circuit.

For example, as shown in FIG. 3, in a case where an output terminal of a p-channel cascode current mirror circuit is connected to an input terminal of an n-channel cascode current mirror circuit to thereby fold an electric current, since a voltage of 2(Vth$_n$+$\alpha_n$)+(Vth$_p$+2$\alpha_p$) or higher is required as a supply voltage Vc (in which subscripts $_n$ and $_p$ of respective parameters represent corresponding channels, respectively), for example, when Vth$_n$=Vth$_p$=1V and $\alpha_n$=$\alpha_p$=0.1V, these cascode current mirror circuits are unable to be used at a general supply voltage of 3.3V.

In view of the above, there has been proposed a circuit structure for lowering an input voltage and an output voltage, for example, a compound current mirror circuit known from U.S. Pat. No. 4,477,782 and the like.

Such as shown in FIG. 4, this compound current mirror circuit has a circuit structure in which an n-channel MOS transistor 11' and a current source 3' are, added to the current mirror circuit shown in FIG. 1, such that a ratio (W/L) of gate width to gate length in the n-channel MOS transistor 11' is ¼ times the W/L of each of other n-channel MOS transistors 11 to 14.

In such a compound current mirror circuit, the gate voltage of the n-channel MOS transistor 12 becomes Vth+2$\alpha$. Thus, each of the n-channel MOS transistors 12, 14 operates in the saturation region when the value of the output voltage Vo is 2$\alpha$ or higher, as shown in FIG. 5. Further, the voltage at the input terminal (i.e., the drain voltage of the n-channel MOS transistor 11) becomes Vth+2$\alpha$. Thus, the input/output voltages required for the transistors to operate in the saturation region are lowered by an amount of the threshold voltage Vth, as compared with the cascode current mirror circuit of FIG. 1.

However, the aforementioned compound current mirror circuit requires two current sources 3, 3' with high precision at the input side, causing problems of complication of circuit structure and increase of the electric current consumption.

The present invention has been carried out in view of the aforementioned circumstances, and it is therefore an object of the present invention to provide a current mirror circuit capable of precisely operating even at low input/output voltages.

DISCLOSURE OF THE INVENTION

To this end, as shown in FIG. 6, a low voltage current mirror circuit according to the present invention including multiple (two in the illustrated example) circuit elements 1A, 1B, each forming a current mirror, and concatenating the circuit elements 1A and 1B to constitute a cascode current mirror circuit, comprises voltage dropping means 2 for mutually connecting inter-control-electrode nodes of each of the circuit elements 1A, 1B to cause the predetermined voltage drop $\beta$ between the inter-control-electrode nodes.

According to such a circuit structure, by providing the voltage dropping means 2, the control-electrode electric potential of the current mirror of the $_1$circuit element 1A becomes (Vth+$\alpha$)+$\beta$, to thereby lower an input voltage and an output voltage by (Vth+$\alpha$)–$\beta$ as compared with the control-electrode electric potential 2(Vth+$\alpha$) in the conventional circuit structure.

The circuit elements 1A, 1B, as shown in FIG. 6, may be constructed such that: the circuit element 1A includes an input transistor TR1 and an output transistor TR2, and the circuit element 1B includes an input transistor TR3 and an output transistor TR4, each of the input transistors TR1, TR3 and output transistors TR2, TR4 provided with a first terminal, a second terminal, and a third terminal connected to a control-electrode, and a current mirror is formed by mutually connecting between the third terminals of the input transistor TR1 and the output transistor TR2, and another current mirror is formed by mutually connecting between the third terminals of the input transistor TR3 and the output transistor TR4; in the adjacent circuit elements 1A, 1B, the first terminal of the input transistor TR3 is mutually connected to the second terminal of the input transistor TR1, and the first terminal of the output transistor TR4 is mutually connected to the second terminal of the output transistor TR2; in the circuit element 1A located at one end of the concatenation, the first terminal and the third terminal of the input transistor TR1 are connected to each other, the first terminal of the input transistor TR1 is supplied with an input current Iin, and the first terminal of the output transistor TR2 is connected to an output terminal 4; and in the circuit element 1B located at the other end of the concatenation, each of the second terminal of the input transistor TR3 and the second terminal of the output transistor TR4 is applied with a reference voltage Vref.

Further, it is preferable that the voltage dropping means 2 causes the voltage drop β corresponding to a voltage a obtained by subtracting a threshold voltage Vth of the input transistor TR1 from a voltage between the second terminal and the third terminal of the input transistor TR1.

In this way, by setting the predetermined voltage drop of the voltage dropping means 2 to be β=α, the electric potential between the third terminals of the input and output transistors TR1, TR2 of the circuit element 1A becomes Vth+2α, so that each of the output transistors TR2, TR4 of the circuit elements 1A, 1B operates in the saturation region when the electric potential at the output terminal 4 is 2α or higher, thereby enabling to obtain a large output resistance.

Further, as shown in FIG. 7, a specific constitution of the voltage dropping means 2 may include a first voltage dropping section 2A for mutually connecting the inter-control-electrode nodes of each of the circuit elements 1A, 1B, and a second voltage dropping section 2B for sending an electric current passed through the first voltage dropping section 2A to an input side current path. Alternatively, as shown in FIG. 8, the second voltage dropping means may be a second voltage dropping section 2B' for sending the electric current passed through the first voltage dropping section 2A to an output side current path.

According to such a construction, since γ+η=Vth+α assuming that the voltage drop by the first voltage dropping section 2A is γ and the voltage drop by the second voltage dropping section 2B is η, the electric potential between the third terminals of the input and output transistors TR1, TR2 of the circuit element 1A becomes (Vth+α)+γ=2(Vth+α)−η, thereby lowering the input voltage and output voltage by η. Particularly, γ=α When η=Vth, so that the electric potential between the third terminals of the input and output transistors TR1, TR2 of the circuit element 1A becomes Vth+2α. Thus, each of the output transistors TR2, TR4 operates in the saturation region when the electric potential at the output terminal 4 is 2α or higher, thereby enabling to obtain a large output resistance.

The above specific constitution has been shown for a case of the two stages of circuit elements. However, such a constitution can be similarly applied to a case for concatenating circuit elements 1A, 1B, 1C in a three-staged manner as shown in FIG. 9, by providing first voltage dropping sections $2A_1$, $2A_2$ and second voltage dropping sections $2B_1$, $2B_2$. Such a constitution can be further extended to four or more stages of circuit elements.

Further, as shown in FIG. 10, another specific constitution of the voltage dropping means 2 may include a first voltage dropping section 2A for mutually connecting inter-control-electrode nodes of each of the circuit elements 1A, 1B, and a third voltage dropping section 2C for connecting between the first voltage dropping section 2A and an end terminal applied with the reference voltage Vth to cause the predetermined voltage drop Vth+α, to thereby send the electric current passed through the first voltage dropping section 2A to the end terminal.

According to such a constitution, the electric potential between the third terminals of the input and output transistors TR3, TR4 of the circuit element 1B becomes Vth+α and the electric potential between the third terminals of the input and output transistors TR1, TR2 of the circuit element 1A becomes (Vth+α)+γ, thereby enabling to lower the input voltage and output voltage, similarly to the above situation.

BEST MODE FOR CARRYING OUT THE INVENTION

There will be described hereinafter a low voltage current mirror circuit according the present invention, with reference to the accompanying drawings.

Figure 1:
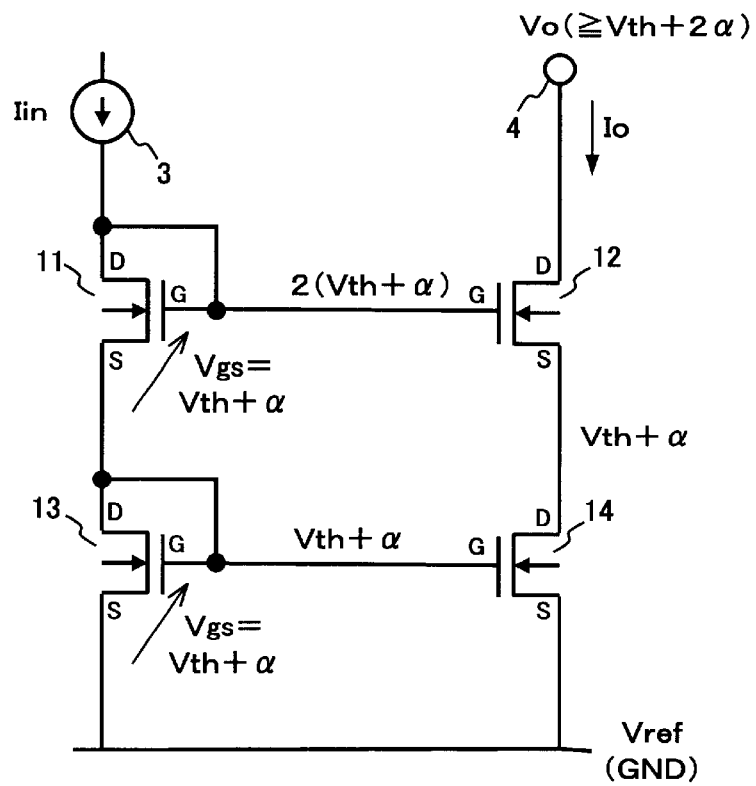
FIG. 1 is a circuit diagram showing an exemplary constitution of a general cascode current mirror circuit.
Figure 2:
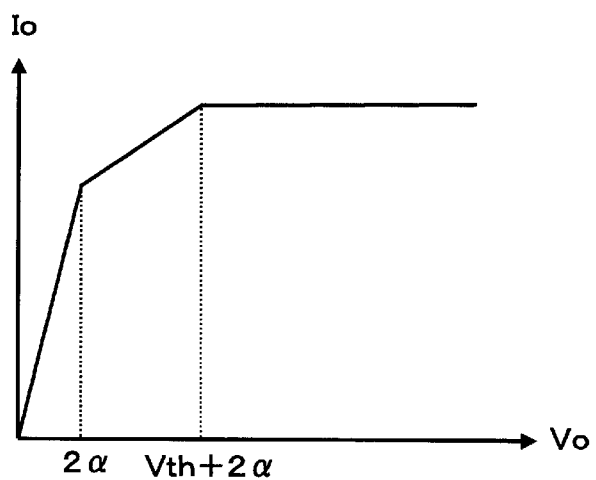
FIG. 2 is a graph showing a relationship between an output voltage Vo and an output current Io in the current mirror circuit of FIG. 1.
Figure 3:
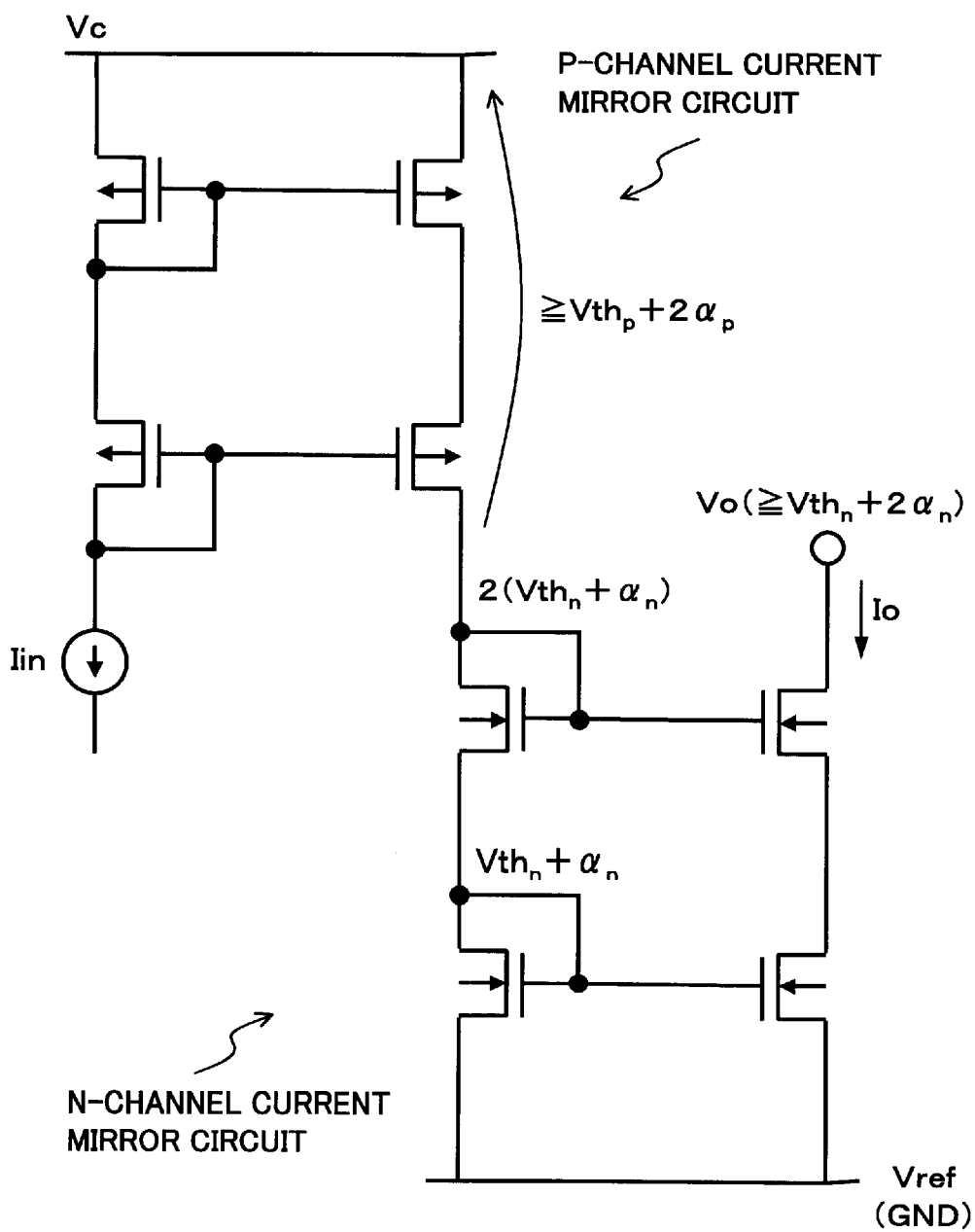
FIG. 3 is a diagram showing an exemplary constitution in case of combining a p-channel cascode current mirror circuit with an n-channel cascode current mirror circuit to thereby fold an electric current.
Figure 4:
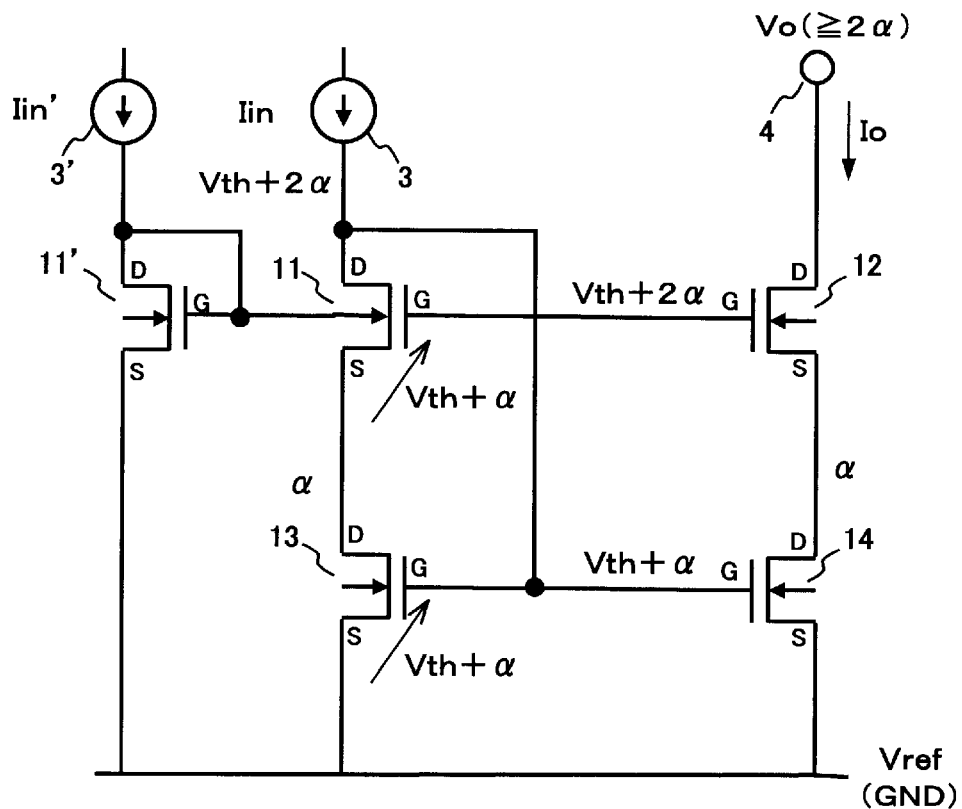
FIG. 4 is a circuit diagram showing an exemplary constitution of a known compound current mirror circuit.
Figure 5:
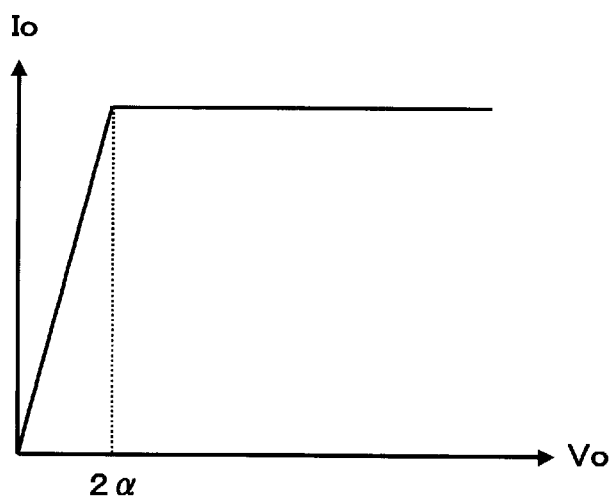
FIG. 5 is a graph showing a relationship between an output voltage Vo and an output current Io in the compound current mirror circuit in FIG 4.
Figure 6:
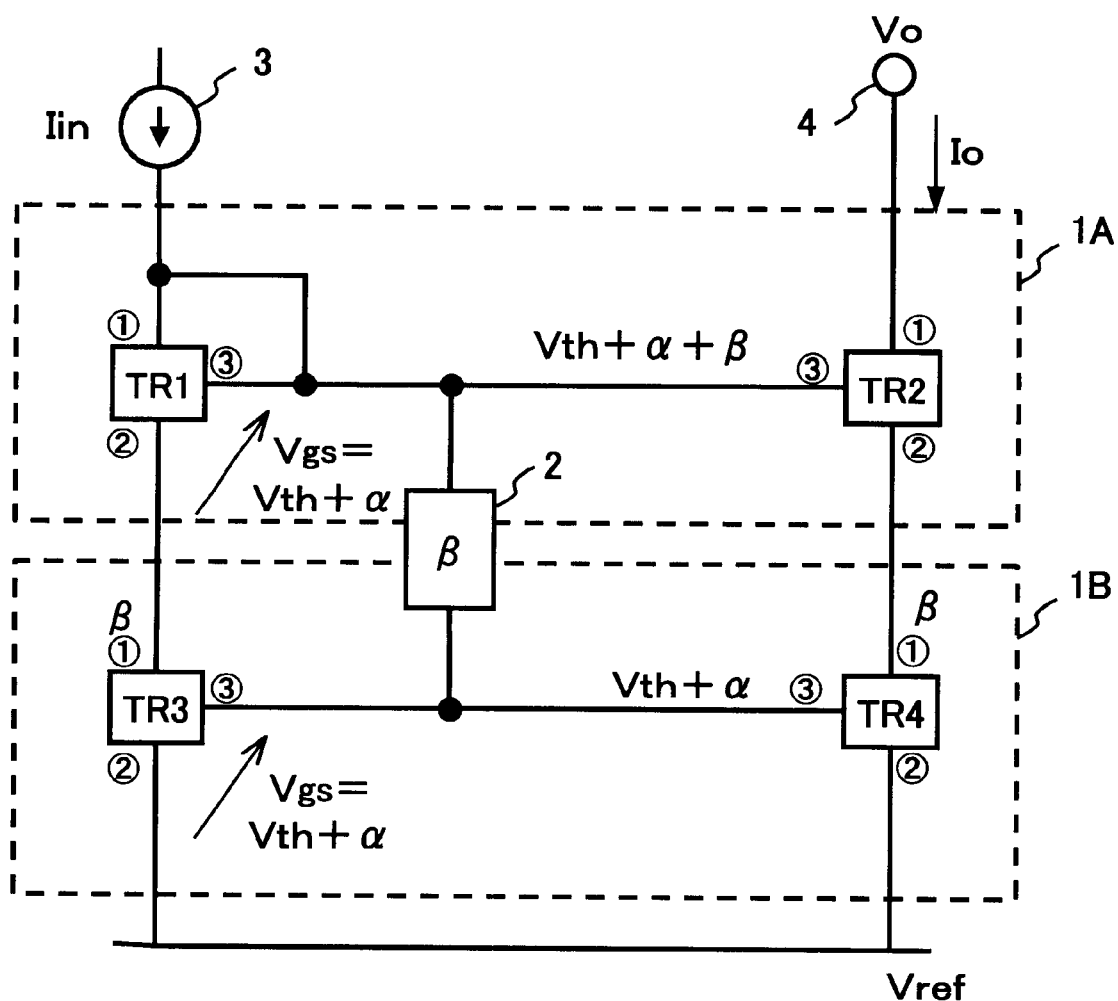
FIG. 6 is a block diagram showing a basic constitution of a low voltage current mirror circuit according to the present invention having a two-staged cascode constitution.
Figure 7:
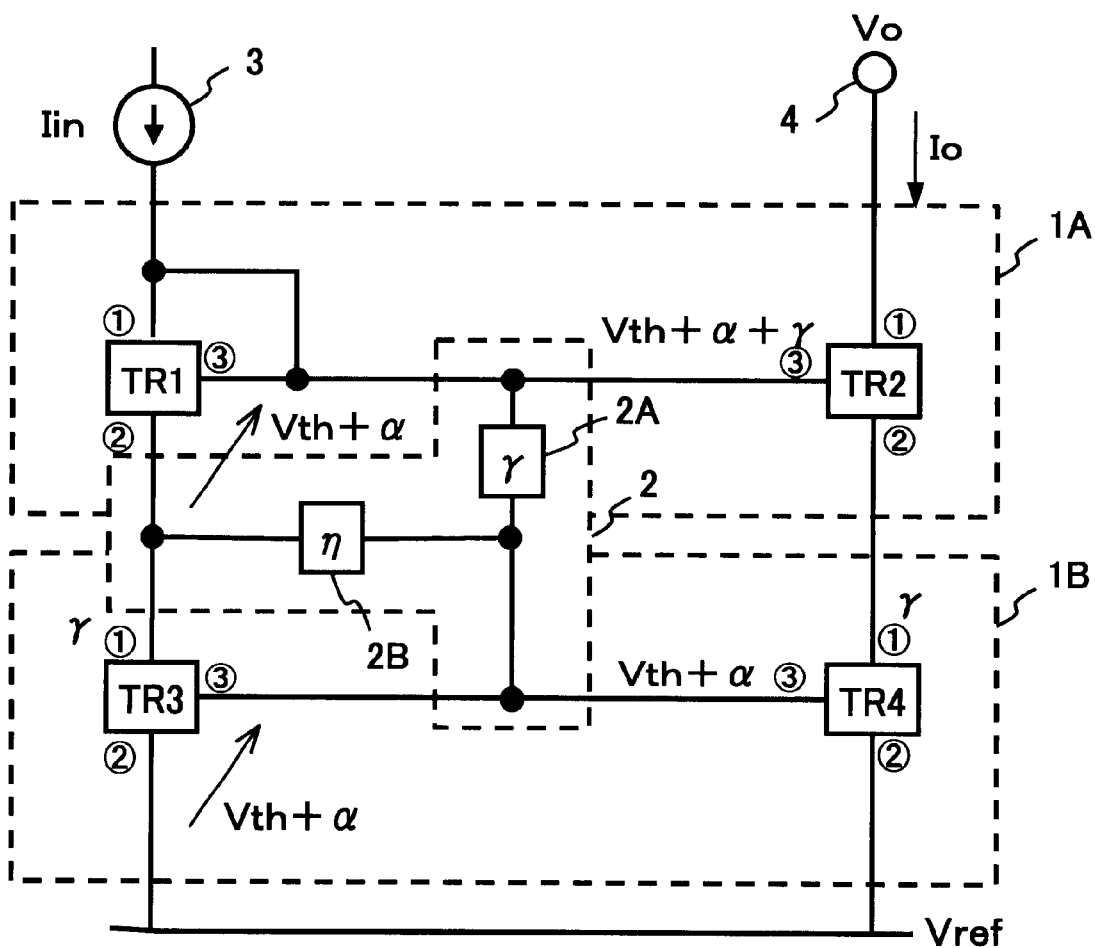
FIG. 7 is a block diagram showing an embodiment implementing voltage dropping means of FIG. 6.
Figure 8:
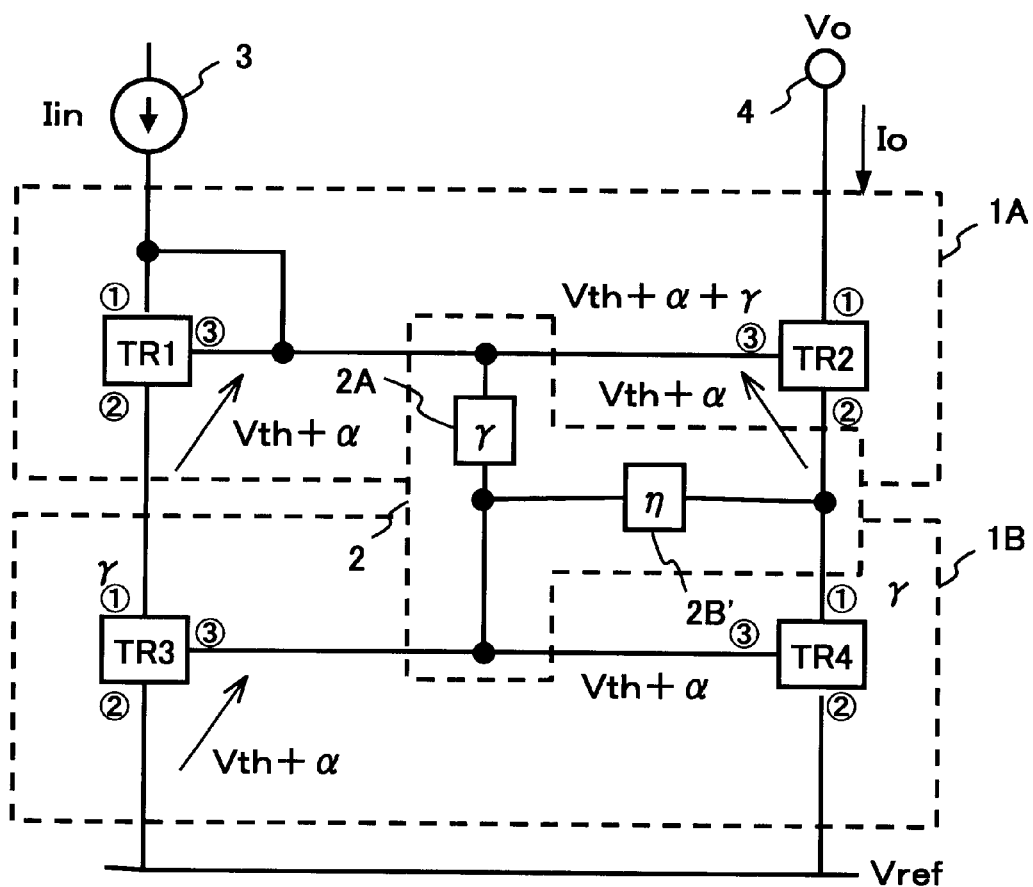
FIG. 8 is a block diagram showing another embodiment implementing the voltage dropping means of FIG. 6.
Figure 9:
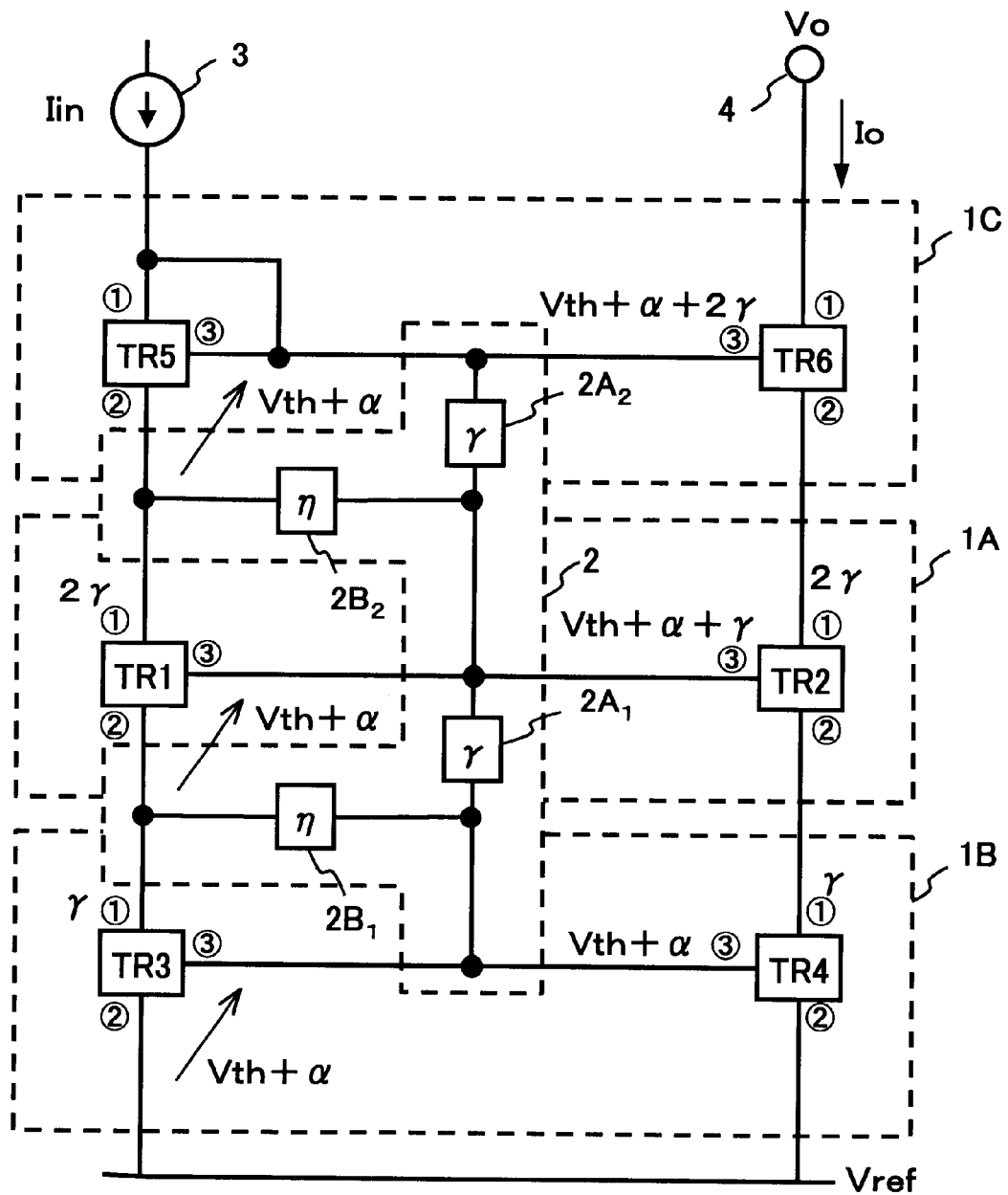
FIG. 9 is a block diagram showing a constitution of a low voltage current mirror circuit according to the present invention having a three-staged cascode constitution.
Figure 10:
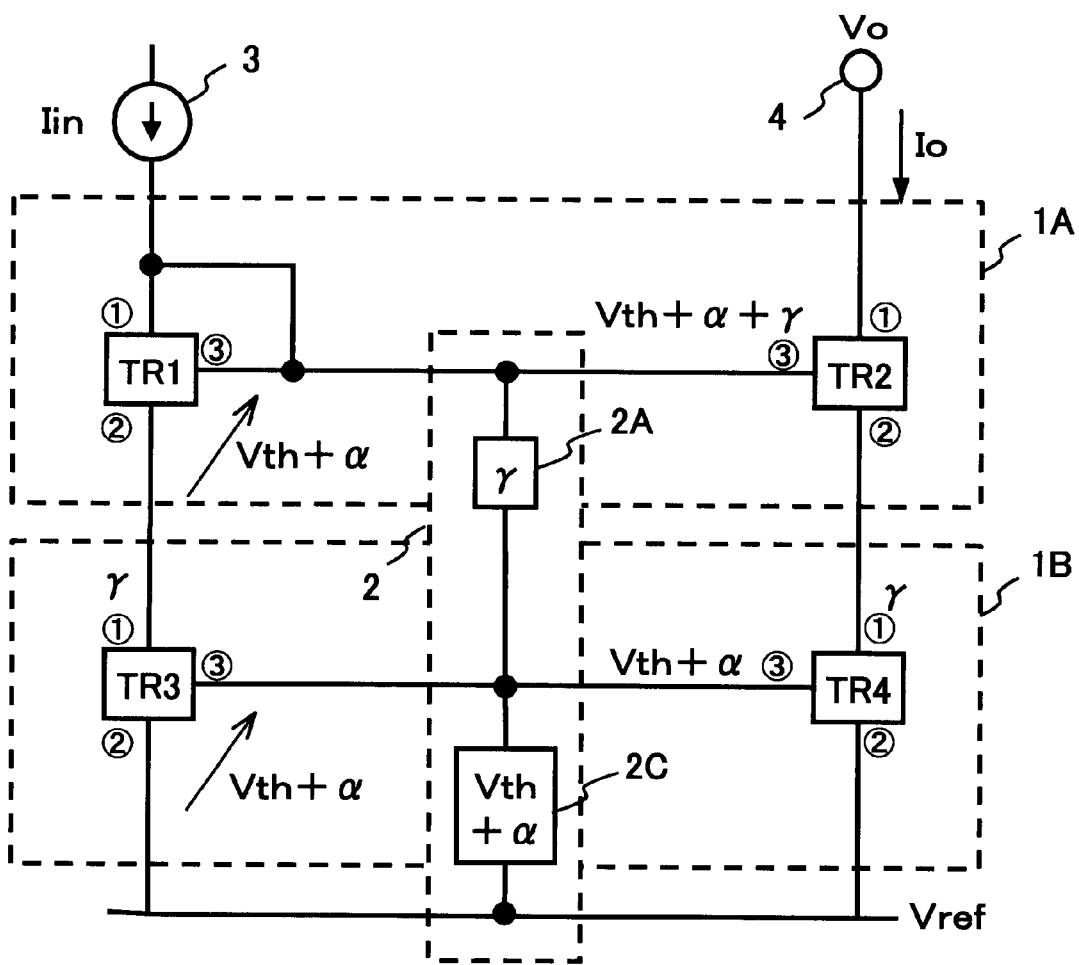
FIG. 10 is a block diagram showing a further embodiment implementing the voltage dropping means of FIG. 6.
Figure 11:
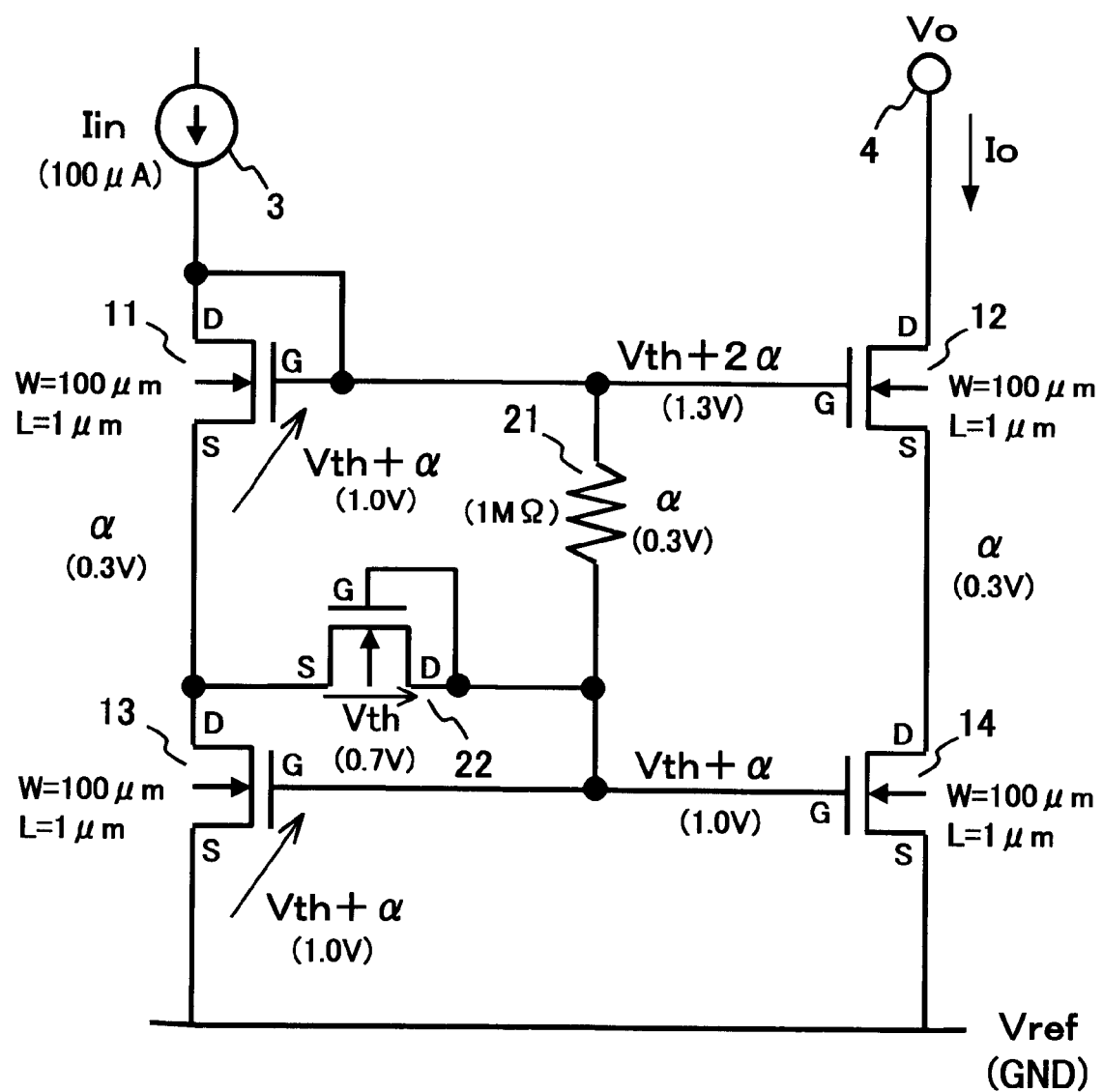
FIG. 11 is a circuit diagram showing a constitution of a low voltage current mirror circuit according to a first embodiment of the present invention.

FIG. 11 is a circuit diagram showing a low voltage current mirror circuit according to a first embodiment of the present invention. Same reference numerals as used in the general circuit structure shown in FIG. 1 are denoted to corresponding or identical elements in FIG. 11, and the same rule applies corresponding to the following.

In FIG. 11, this low voltage current mirror circuit comprises: for example, an n-channel MOS transistor 11 as an input transistor and an n-channel MOS transistor 12 as an output transistor, cooperatively constituting a first stage current mirror (circuit element); an n-channel MOS transistor 13 as an input transistor and an n-channel MOS transistor 14 as an output transistor, concatenated (here, cascoded) to the first stage current mirror and cooperatively constituting a second stage current mirror (circuit element); a resistor 21 as a first voltage dropping section; an n-channel MOS transistor 22 as a second voltage dropping section; a current source 3 for supplying an input current Iin; and an output terminal 4. Here, a drain terminal, a source terminal and a gate terminal of each n-channel MOS transistor corresponds to a first terminal, a second terminal and a third terminal, respectively.

The n-channel MOS transistor 11 has the drain terminal supplied with the input current Iin from the current source 3, and the gate terminal mutually connected to the drain terminal. The n-channel MOS transistor 12 has the drain terminal connected to the output terminal 4, and the gate terminal (control-electrode) connected to the gate terminal of the n-channel MOS transistor 11. The n-channel MOS transistor 13 has the drain terminal connected to the source terminal of the n-channel MOS transistor 11, and the source terminal applied with a reference voltage Vref. The n-channel MOS transistor 14 has the drain terminal connected to the source terminal of the n-channel MOS transistor 12, the gate terminal connected to the gate terminal of the n-channel MOS transistor 13, and the source terminal applied with the reference voltage Vref. Here, the reference voltage Vref is set at a ground (GND) level.

The resistor 21 has one end connected to a node between the gate terminals of n-channel MOS transistors 11, 12, and the other end connected to a node between the gate terminals of n-channel MOS transistors 13, 14. The n-channel MOS transistor 22 is short-circuited between the drain terminal and gate terminal thereof to form a forward diode-connected configuration, and this drain terminal is connected to the other end of the resistor 21, and the source terminal of the n-channel MOS transistor 22 is connected to the drain terminal of the n-channel MOS transistor 13.

There will be described hereinafter a circuit operation of the first embodiment, based on the following exemplary specific set values.

It is now assumed that, for each of the n-channel MOS transistors 11 to 14, 22, a channel width W is 100 $\mu$m and a channel length L is 1 $\mu$m, and that a threshold voltage Vth is 0.7V and a voltage $\alpha$ when a drain current is 100 $\mu$A is 0.3V. It is further assumed that the input current Iin is 100 $\mu$A and a resistance value of the resistor 21 is 1 M$\Omega$. Note, the current mirror circuit according to the present invention is not limited to the above set values. Further, although all of the n-channel MOS transistors 11 to 14 have been assumed to have the same channel length L and channel width W, it is possible to appropriately set the size of each transistor corresponding to a ratio of an output current Io to the input current Iin.

In the above setting, when an electric current of the same value as the input current Iin flows through each of the n-channel MOS transistors 11 to 14, a gate/source voltage Vgs of each of n-channel MOS transistors 11 to 14 becomes Vth+$\alpha$=0.7+0.3=1.0[V]. When the resistor 21 his a sufficiently large resistance value such as 1 M$\Omega$, an electric current flowing through the resistor 21 and the n-channel MOS transistor 22 becomes a negligibly smaller value as compared with the input current Iin. As a result, an electric potential difference Vth equal to the threshold voltage is generated between the drain and source terminals of the n-channel MOS transistor 22, so that there is generated, across the resistor 21, an electric potential difference $V_{21}$ obtained by subtracting the threshold voltage Vth of the n-channel MOS transistor 22 from the gate/source voltage Vgs of the n-channel MOS transistor 11. This results in $V_{21}=\alpha=0.3$[V], since the voltage drop Vth+$V_{21}$ by the n-channel MOS transistor 22 and resistor 21 is equal to the gate/source voltage Vgs=Vth+$\alpha$ of the n-channel MOS transistor 11.

The electric potential at the node between the gate terminals of n-channel MOS transistors 13, 14 becomes Vgs=Vth+$\alpha$=1.0[V], since the input current Iin flows through the n-channel MOS transistor 13, as in the n-channel MOS transistor 11. Thus, the electric potential at the node between the gate terminals of n-channel MOS transistors 11, 12 becomes (Vth+$\alpha$)+$\alpha$=1.0+0.3=1.3[V], which is a value obtained by adding the voltage $V_{21}=\alpha$ at the opposite ends of the resistor 21 to the electric potential between the gate terminals of n-channel MOS transistors 13, 14. Further, the electric potential of each of the drain terminals of n-channel MOS transistors 13,14 becomes (Vth+2$\alpha$)−(Vth+$\alpha$)=$\alpha$=0.3 [V], which is a value obtained by subtracting the gate/source voltage Vgs=Vth+$\alpha$ of the n-channel MOS transistors 11, 12 from the electric potential between the gate terminals of n-channel MOS transistors 11, 12. At this time, since the n-channel MOS transistor 14 is operating in the saturation region, in order for the n-channel MOS transistor 12 to also operate in the saturation region, it is enough that the electric potential (output voltage Vo) of the output terminal 4 is 2$\alpha$ or higher. Further, if the input voltage Vin is Vth+2$\alpha$ or higher, each of the n-channel MOS transistors 11 to 14 is brought to operate in the saturation region.

According to the first embodiment as described above, the resistor 21 an d the diode-connected n-channel MOS transistor 22 are adopted to generate the electric potential difference $\alpha$ between the inter-gate-terminal nodes in the two-staged cascode current mirror circuit. Thereby, each of the n-channel MOS transistors 11 to 14 operates in the saturation region so as to obtain the output current Io with high precision, when the input voltage Vin is Vth+2$\alpha$ or higher and the output voltage Vo is 2$\alpha$ or higher. In this way, it is possible to provide a current mirror circuit capable of precisely operating at low input/output voltages. Further, since the current mirror circuit of the present invention requires only the single current source 3 at the input side, it becomes possible to simplify the circuit structure and to reduce the electric current consumption as compared with the conventional compound current mirror circuit.

Figure 12:
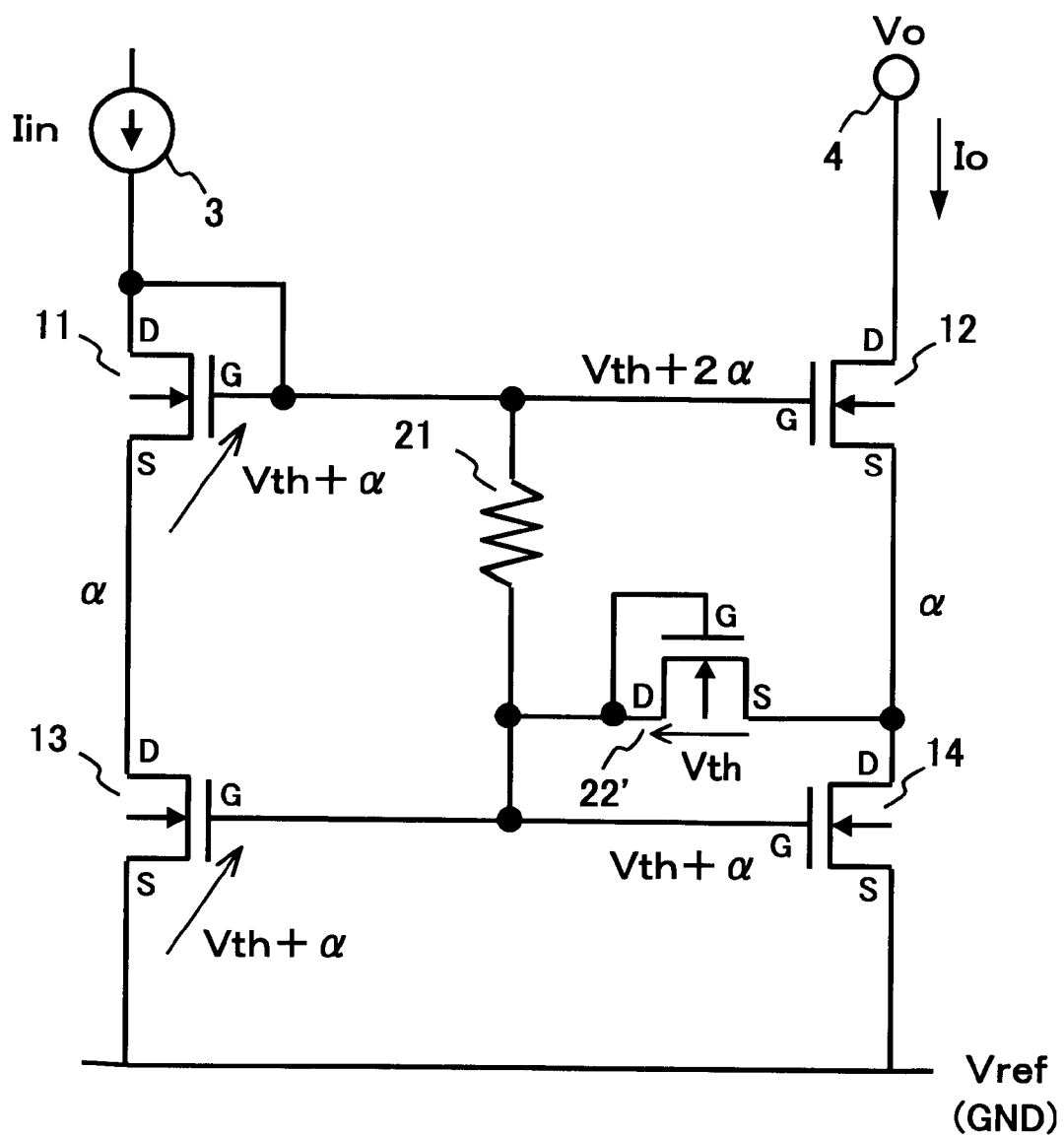
FIG. 12 is a circuit diagram showing another exemplary constitution concerning the first embodiment.

In the above first embodiment, the source terminal of the n-channel MOS transistor 22 serving as the second voltage dropping section is connected to the drain terminal of the n-channel MOS transistor 13, to thereby send the electric current passed through the resistor 21 to an input side current path. However, as shown in FIG. 12, it is also possible to connect a source terminal of a n-channel MOS transistor 22' to the drain terminal of the n-channel MOS transistor 14, to thereby send the electric current passed through the resistor 21 to an output side current path.

Further, the resistor 21 has been used as the first voltage dropping section, in the first embodiment. However, the first voltage dropping section of the present invention is not limited thereto. For example, it is also possible to adopt, instead of the resistor 21, a reverse bias diode or diode-connected transistor and the like as an element for providing a smaller current at an arbitrary electric potential difference. Further, the diode-connected n-channel MOS transistor 22 has been used as the second voltage dropping section. However, the second voltage dropping section of the present invention is not limited thereto. It is possible to adopt a resistor or diode as an element for generating the voltage Vth, instead of the n-channel MOS transistor 22.

There will be described hereinafter a second embodiment according to the present invention.

Figure 13:
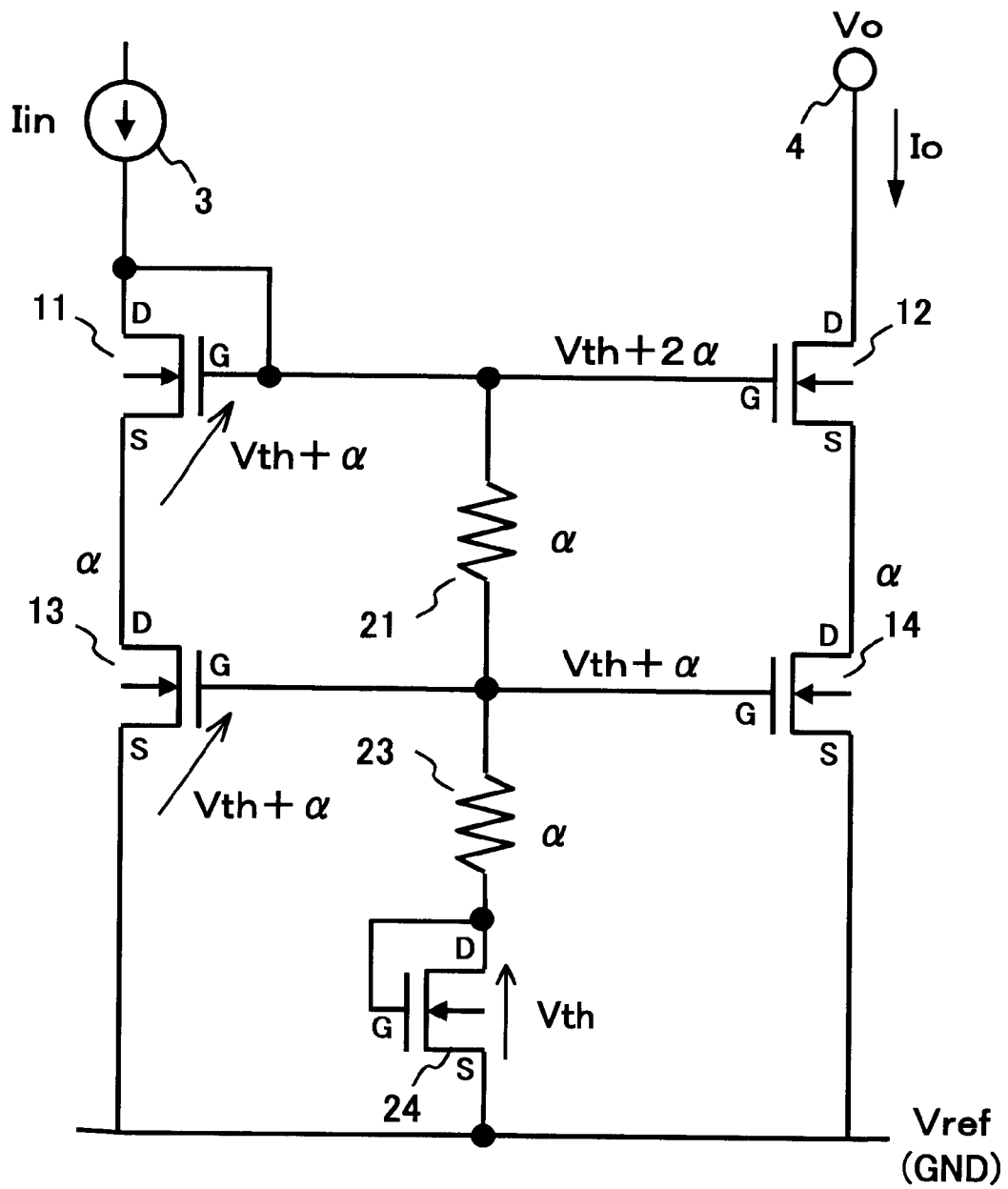
FIG. 13 is a circuit diagram showing a constitution of a low voltage current mirror circuit according to a second embodiment of the present invention.

FIG. 13 is a circuit diagram showing a low voltage current mirror circuit according to the second embodiment of the present invention.

In FIG. 13, this current mirror circuit differs from the above first embodiment in that a resistor 23 and an n-channel MOS transistor 24, cooperatively acting as a third voltage dropping section, is provided, instead of the diode-connected n-channel MOS transistor 22 having been used as the second voltage dropping section. Those constitutions other than the above are the same as the first embodiment.

The resistor 23 has one end connected to the node between the gate terminals of n-channel MOS transistors 13, 14 and the other end connected to a drain terminal of the n-channel MOS transistor 24, and has a resistance value coincident with the resistance value of the resistor 21. The n-channel MOS transistor 24 is short-circuited between the drain terminal and gate terminal thereof to form a forward diode-connected configuration, and a source terminal of the n-channel MOS transistor 24 is applied with the reference voltage Vref. Here, it is also assumed that the reference voltage Vref is set at the ground (GND) level, and the size of the n-channel MOS transistor 24 is the same as each of n-channel MOS transistors 11 to 14.

In the current mirror circuit having such a constitution, the resistance value of the resistor 23 is sufficiently large as well as that of the resistor 21, so that an electric current flowing through the resistor 23 and n-channel MOS transistor 24 becomes a negligibly smaller value as compared with the input current Iin. As a result, an electric potential difference Vth equal to the threshold voltage is generated between the drain and source terminals of the n-channel MOS transistor 24, so that there is generated, across the resistor 23, an electric potential difference $V_{23}$ obtained by subtracting the threshold voltage Vth of the n-channel MOS transistor 24 from the gate/source voltage Vgs of the n-channel MOS transistor 13. This leads $V_{23}=\alpha$, since the voltage drop Vth+$V_{23}$ by the n-channel MOS transistor 24 and resistor 23 is equal to the gate/source voltage Vgs=Vth+$\alpha$ of the n-channel MOS transistor 13.

Thus, the electric potential at the node between the gate terminals of in-channel MOS transistors 13, 14 becomes Vth+$\alpha$. Further, the electric potential at the node between the gate terminals of n-channel MOS transistors 11, 12 becomes Vth+2$\alpha$, which is a value obtained by adding the voltage $V_{21}=\alpha$ at the opposite ends of the resistor 21 to the electric potential between the gate terminals of n-channel MOS transistors 13, 14. Further, the electric potential of each of the drain terminals of n-channel MOS transistors 13, 14 becomes (Vth+2$\alpha$)−(Vth+$\alpha$)=$\alpha$, which is a value obtained by subtracting the gate/source voltage Vgs=Vth+$\alpha$ of the n-channel MOS transistors 11, 12 from the electric potential between the gate terminals of n-channel MOS transistors 11, 12. Such electric potentials at respective portions are the same as those in the first embodiment, so that each of the n-channel MOS transistors 11 to 14 operates in the saturation region when the input voltage Vin is Vth+2$\alpha$ or higher and the output voltage Vo is 2$\alpha$ or higher, to thereby obtain the output current Io with high precision.

According to the above second embodiment, the same effect as the first embodiment can be obtained, by connecting between: the node between the gate terminals of n-channel MOS transistors 13, 14; and the reference voltage Vref level, using the resistor 23 and the diode-connected n-channel MOS transistor 24.

There will be described hereinafter a third embodiment according to the present invention. In the third embodiment, there will be considered a case where the present invention is applied to a three-staged cascode current mirror circuit, for example.

Figure 14:
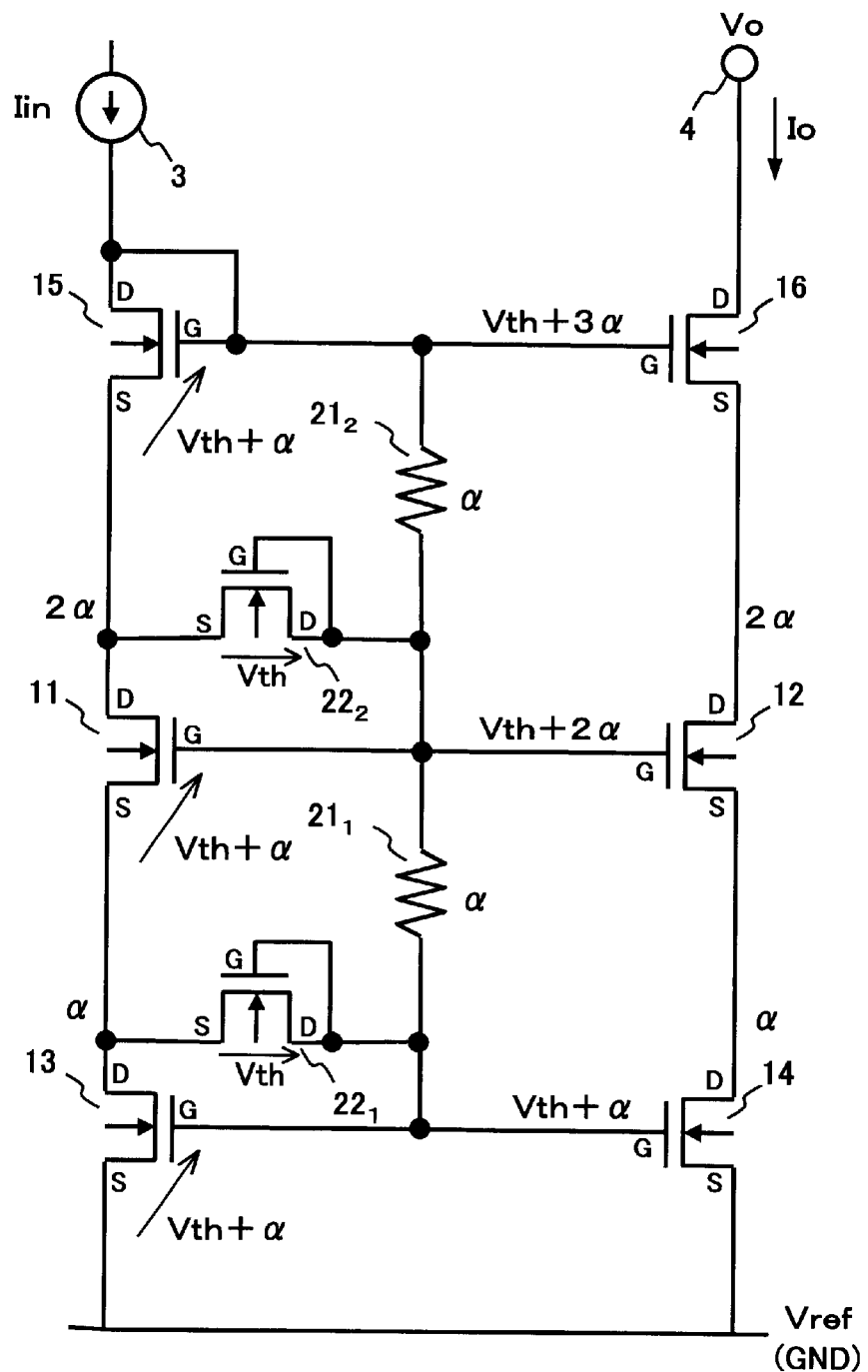
FIG. 14 is a circuit diagram showing a constitution of a low voltage current mirror circuit according to a third embodiment of the present invention.

FIG. 14 is a circuit diagram showing a constitution of a low voltage current mirror circuit according to the third embodiment of the present invention.

In FIG. 14, this current mirror circuit is formed into a three-staged cascode constitution, by concatenating an n-channel MOS transistor 15 as an input transistor and an n-channel MOS transistor 16 as an output transistor, cooperatively constituting a third stage current mirror (circuit element) to the current mirror constituted of the n-channel MOS transistors 11, 12 such as in the first embodiment (refer to FIG. 11). Further, inter-gate-terminal nodes of current mirrors at the respective stages are connected via resistors $21_1$, $21_2$, respectively, and there are provided n-channel MOS transistors $22_1$, $22_2$ for sending the currents flowing through the resistors $21_1$, $21_2$ to the input side current path.

Specifically, the n-channel MOS transistor 15 has a drain terminal supplied with the input current Iin from the current source 3, a gate terminal mutually connected to the drain terminal, and a source terminal connected to the drain terminal of the n-channel MOS transistor 11. The n-channel MOS transistor 16 has a drain terminal connected to the output terminal 4, a gate terminal (control-electrode) connected to the gate terminal of the n-channel MOS transistor 15, and a source terminal connected to the drain terminal of the n-channel MOS transistor 12.

The resistor $21_1$ and the n-channel MOS transistor $22_1$ correspond to the resistor 21 and the n-channel MOS transistor 22 of the first embodiment, respectively. Further, the resistor $21_2$ has one end connected to a node between the gate terminals of n-channel MOS transistors 15, 16, and the other end connected to the node between the gate terminals of n-channel MOS transistors 11, 12. The n-channel MOS transistor $22_2$ is short-circuited between the drain terminal and the gate terminal to form a forward diode-connected configuration, and this drain terminal is connected to the other end of the resistor $21_2$, and the source terminal of the n-channel MOS transistor $22_2$ is connected to the drain terminal of the n-channel MOS transistor 11.

An operation of such a three-staged cascode current mirror circuit can be considered, basically in the same manner as the two-staged cascode current mirror circuit in the first embodiment. Namely, when an electric current of the same value as the input current Iin flows through each of the n-channel MOS transistors 11 to 16 is flowed, the gate/source voltage Vgs of each of the n-channel MOS transistors 11 to 16 becomes Vth+$\alpha$. If each of resistance values of the resistors $21_1$, $21_2$ is sufficiently large, the electric currents flowing through the resistor $21_1$ and n-channel MOS transistor $22_1$ and through the resistor $21_2$ and n-channel MOS transistor $22_2$ become negligibly smaller values as compared with the input current Iin. As a result, an electric potential difference Vth equal to the threshold voltage is generated between the drain and source terminals of each of the n-channel MOS transistors $22_1$, $22_2$. Thus, the voltage drop by each of the resistors $21_1$, $21_2$ becomes α.

Thus, the electric potentials at the nodes between the gate terminals of n-channel MOS transistors 13, 14, at the nodes between the gate terminals of n-channel MOS transistors 11, 12, and at the nodes between the gate terminals of n-channel MOS transistors 15, 16, become Vth+α, Vth+2α and Vth+3α, respectively. Accordingly, each of the n-channel MOS transistors 11 to 16 operates in the saturation region, when an input voltage Vin is Vth+3α or higher and the output voltage Vo is 3α or higher.

According to the third embodiment as described above, it becomes also possible to provide a three-staged cascode current mirror circuit which precisely operates at low input/output voltages with a simple circuit structure and with a reduced electric current consumption, as compared with the conventional circuit.

The third embodiment has been constituted to send the currents passed through the resistors $21_1$, $21_2$ to the input-side current path via the n-channel MOS transistors $22_1$, $22_2$, respectively. However, it is also possible to connect the source terminals of n-channel MOS transistors $22_1$, $22_2$ to the drain terminals of n-channel MOS transistors 12, 14, respectively, to thereby send the currents to the output side, similarly to the case shown in FIG. 12.

Figure 15:
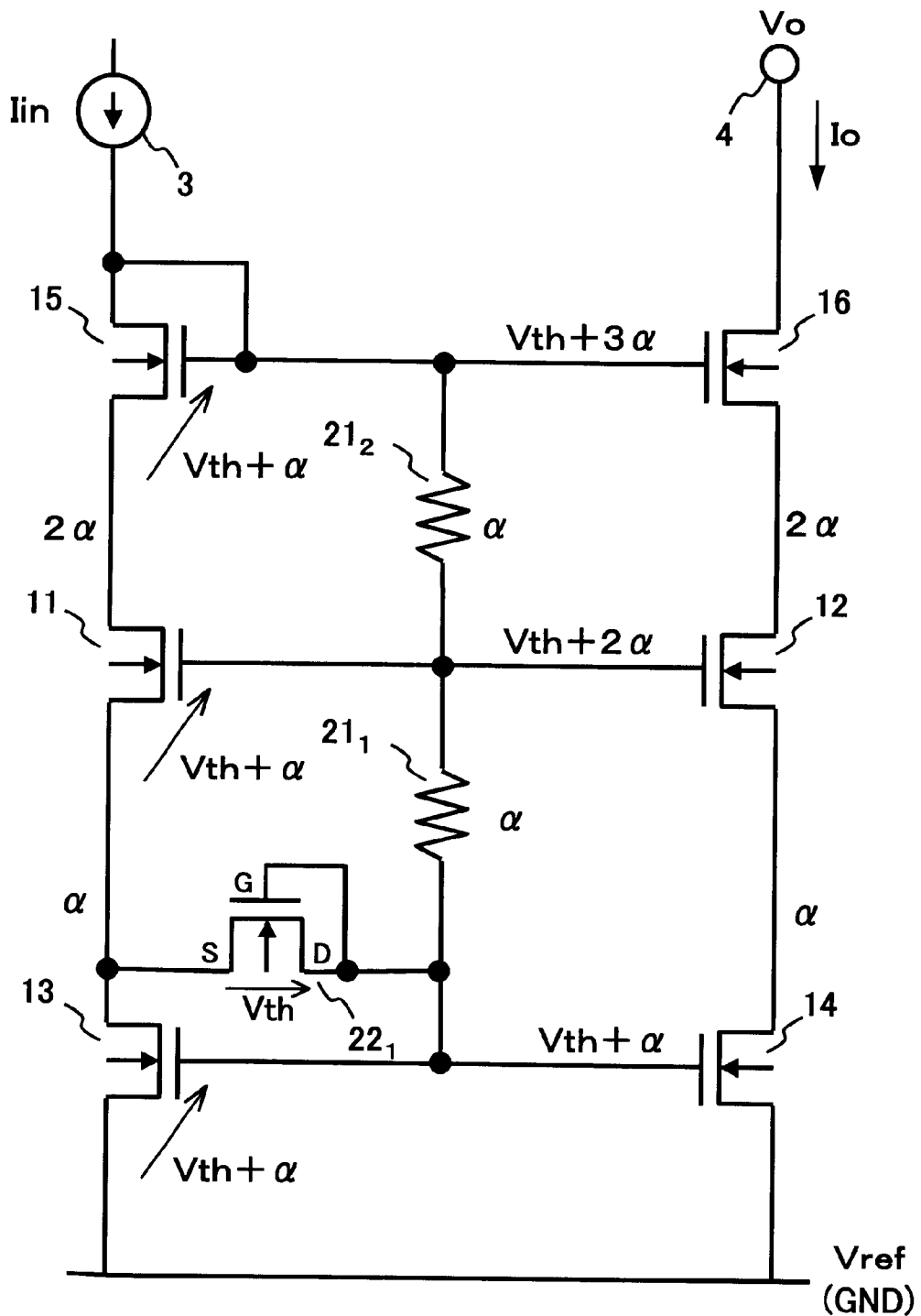
FIG. 15 is a circuit diagram showing another exemplary constitution concerning the third embodiment.

Further it is also possible to omit the n-channel MOS transistor $22_2$ as shown in FIG. 15, when resistance value of the resistor $21_1$ is equal to that of the resistor 212.

The above first through third embodiments have been described based on the two-staged or three-staged cascode current mirror circuit. However, it is also possible to apply the present invention to a four or more-staged cascode current mirror circuit, in the same manner as in the aforementioned embodiments.

INDUSTRIAL APPLICABILITY

The present invention has a large industrial applicability concerning a current mirror circuit to be used in general electric circuits such as semiconductor integrated circuits.

What is claimed is:

1. A low voltage current mirror circuit which includes multiple circuit elements, each forming a current mirror, and concatenates said circuit elements to constitute a cascode current mirror circuit, comprising: voltage dropping means for mutually connecting inter-control-electrode nodes of said each of circuit elements to cause the predetermined voltage drop between the inter-control-electrode nodes, wherein each of said circuit elements includes an input transistor and an output transistor, each provided with a first terminal, a second terminal, and a third terminal connected to a control-electrode, and forms a current mirror by mutually connecting between the third terminals of said input transistor and said output transistor, in said adjacent circuit elements, the first terminal of the one input transistor is mutually connected to the second terminal of the other input transistor, and the first terminal of the one output transistor is mutually connected to the second terminal of the other output transistor, in said circuit element located at one end of the concatenation, the first terminal and the third terminal of the input transistor are connected to each other, the first terminal is supplied with an input current, and the first terminal of the output transistor is connected to an output terminal, in the circuit element located at the other end of the concatenation, each of the second terminal of the input transistor and the second terminal of the output transistor is applied with a reference voltage, said voltage dropping means causes the voltage drop corresponding to a voltage obtained by subtracting a threshold voltage of said input transistor from a voltage between the second terminal and the third terminal of said input transistor.

2. A low voltage current mirror circuit according to claim 1, wherein said voltage dropping means includes a first voltage dropping section for mutually connecting the inter-control-electrode nodes of each of said circuit elements, and a second voltage dropping section for sending an electric current passed through said first voltage dropping section to either an input side current path or an output side current path.

3. A low voltage current mirror circuit according to claim 2, wherein at least one of said first and second voltage dropping sections includes a resistor.

4. A low voltage current mirror circuit according to claim 2, wherein at least one of said first and second voltage dropping sections includes a diode.

5. A low voltage current mirror circuit according to claim 2, wherein at least one of said first and second voltage dropping sections includes a diode-connected transistor.

6. A low voltage current mirror circuit according to claim 1, wherein said voltage dropping means includes a first voltage dropping section for mutually connecting inter-control-electrode nodes of each of said circuit elements, and a third voltage dropping section for connecting between said first voltage dropping section and an end terminal applied with said reference voltage to cause the predetermined voltage drop, to thereby send the electric current passed through the first voltage dropping section to said end terminal.

\* \* \* \* \*